(12) United States Patent
Matsubara

(10) Patent No.: US 6,950,363 B2
(45) Date of Patent: Sep. 27, 2005

(54) SEMICONDUCTOR MEMORY DEVICE

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 6 days.

(21) Appl. No.: 10/653,160

(22) Filed: Sep. 3, 2003

(65) Prior Publication Data

US 2004/0042330 A1 Mar. 4, 2004

(30) Foreign Application Priority Data

Sep. 4, 2002 (JP) ......................................... 2002-259448

(51) Int. Cl.⁷ .............................................. G11C 7/00
(52) U.S. Cl. .................................. 365/222; 365/230.03
(58) Field of Search .............................. 365/222, 230.03

(56) References Cited

U.S. PATENT DOCUMENTS

| | | | | |
|---|---|---|---|---|
| 4,933,907 A | * | 6/1990 | Kumanoya et al. | ......... 365/222 |
| 4,984,210 A | * | 1/1991 | Kumanoya et al. | ......... 365/222 |
| 5,251,176 A | * | 10/1993 | Komatsu | ...................... 365/222 |
| 5,515,331 A | * | 5/1996 | Kim | ............................. 365/222 |
| 5,608,682 A | * | 3/1997 | Jinbo et al. | .................. 365/222 |
| 5,828,619 A | * | 10/1998 | Hirano et al. | ................ 365/222 |
| 6,118,719 A | * | 9/2000 | Dell et al. | ................... 365/222 |
| 6,343,043 B2 | * | 1/2002 | Kai et al. | .................... 365/222 |
| 6,597,614 B2 | * | 7/2003 | Nam et al. | ................... 365/222 |

FOREIGN PATENT DOCUMENTS

| | | |
|---|---|---|
| JP | 7-93971 | 4/1995 |
| JP | 11-39862 | 2/1999 |
| JP | 11-120772 | 4/1999 |
| JP | 2000-315385 | 11/2000 |
| JP | 2001-6356 | 1/2001 |
| JP | 2001-283586 | 10/2001 |

* cited by examiner

*Primary Examiner*—Tan T. Nguyen
(74) *Attorney, Agent, or Firm*—McGinn & Gibb, PLLC

(57) ABSTRACT

A semiconductor memory device which can reduce the frequency of a CBR (column before row) refresh operation comprises a memory cell array having a plurality of memory cells, and a CBR refresh unit responsive to m receptions of CBR refresh commands for performing a refresh operation once for the memory cell array.

27 Claims, 8 Drawing Sheets

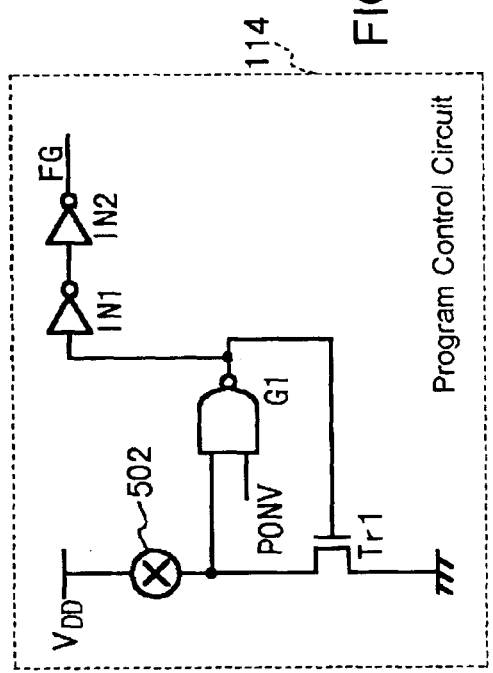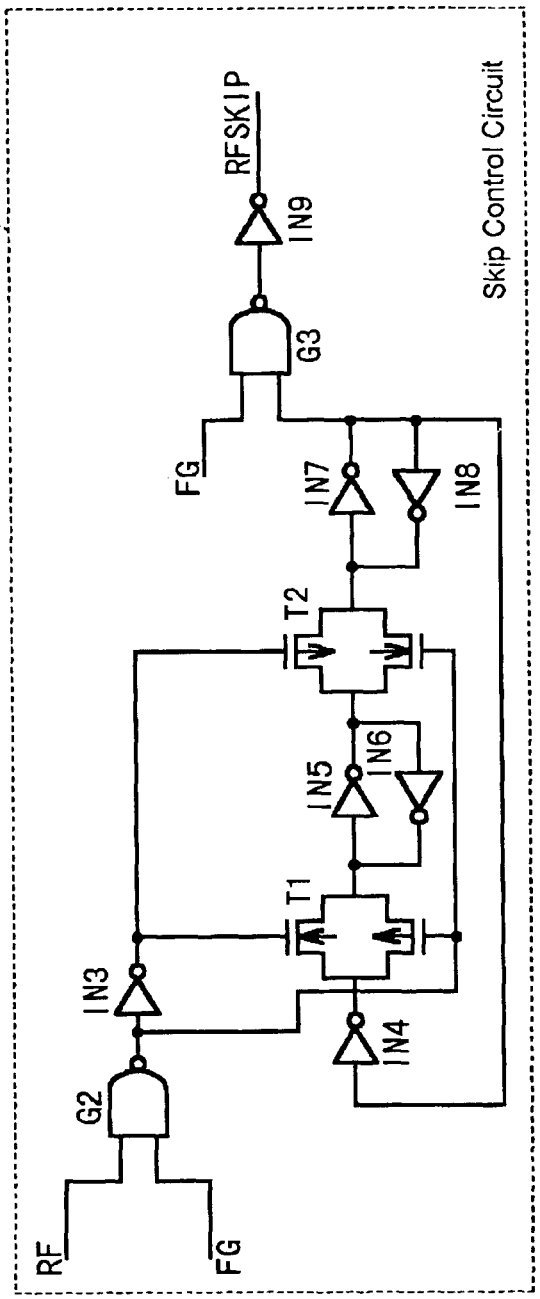

FIG. 3A  VDD 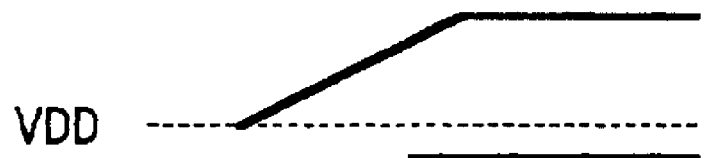
FIG. 3B  PONV 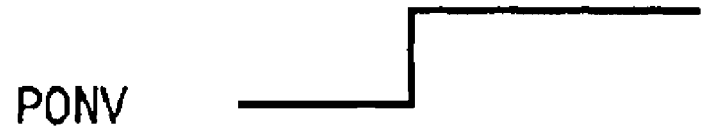
FIG. 3C  FG 
FIG. 3D  VDD 
FIG. 3E  PONV 
FIG. 3F  FG 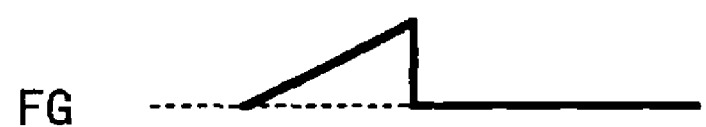

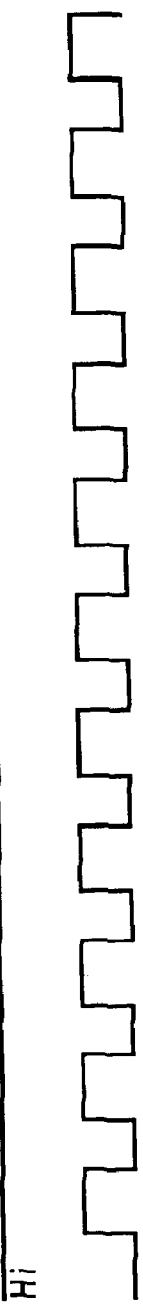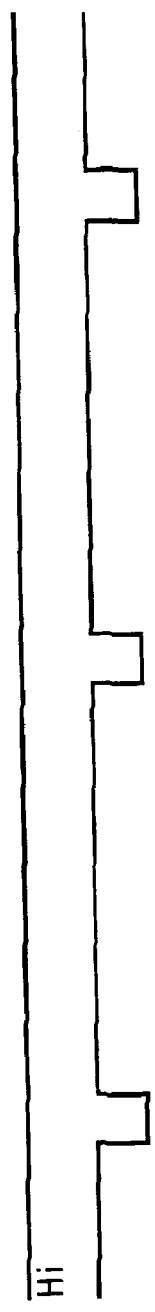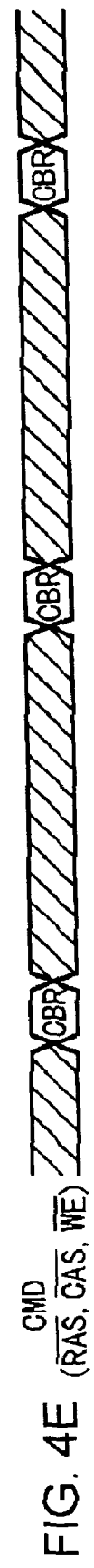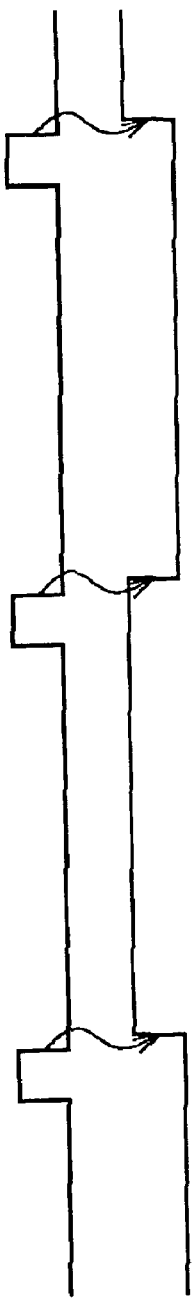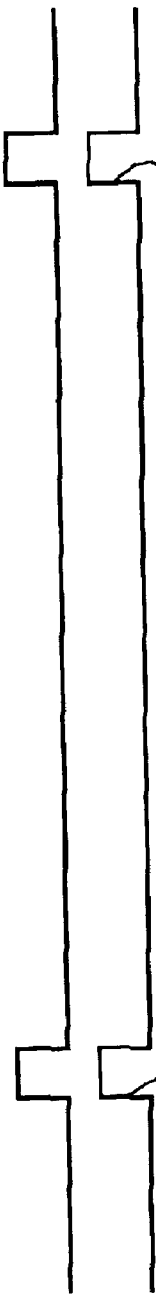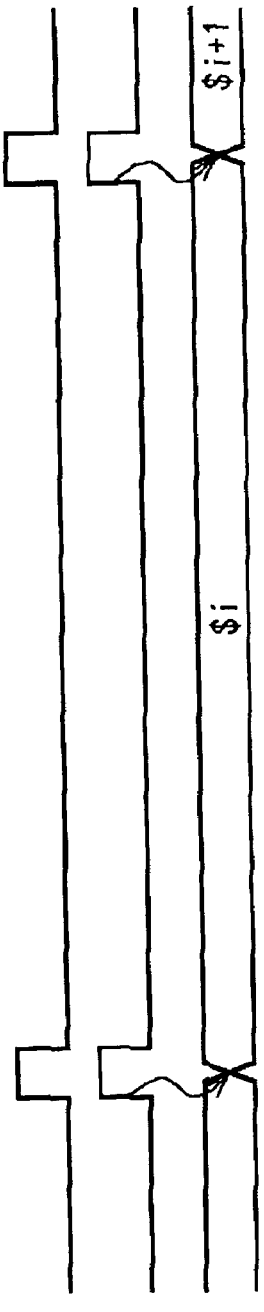
FIG. 4A FG
FIG. 4B CLK
FIG. 4C CKE
FIG. 4D $\overline{CS}$
FIG. 4E CMD ($\overline{RAS}$, $\overline{CAS}$, $\overline{WE}$)
FIG. 4F RF
FIG. 4G RFSKIP
FIG. 4H YRF
FIG. 4I ACBR
FIG. 4J INTADD

SEMICONDUCTOR MEMORY DEVICE

BACKGROUND OF THE INVENTION

1. Field of the Invention

The present invention relates to a semiconductor memory device, and more particularly to a semiconductor memory device which can reduce the frequency of a CBR (column before row) refresh operation.

2. Description of the Related Art

The storage capacity of a DRAM (dynamic random access memory) has been increased year by year, and in its progress, a DRAM having the capacity of one Gigabit has been manufactured on a trial basis. On the other hand, a technology for reducing a leak current of memory cells in a DRAM has been remarkably advanced with efforts to improve the semiconductor device fabrication process. Actually, however, the technology for reducing a leak current depends largely on the level of manufacturing technologies.

Specifically describing in terms of a holding time which refers to a time for which a memory cell can hold data therein without refresh operation, a first DRAM has a holding time of merely 200 milliseconds, whereas a second DRAM, which is identical in specifications to the first DRAM, can have a holding time of 800 milliseconds.

However, the specifications related to the holding time of DRAM define 64 milliseconds which can be achieved by any product. Therefore, in a device which is provided with DRAMs, CBR refresh commands are issued frequently enough to cover the address space of each DRAM during a period of 64 milliseconds. In this event, although the second DRAM has a holding time four times as long as the first DRAM, the second DRAM consumes a current associated with the CBR refresh operation equivalent to the first DRAM which has a shorter holding time.

In relation to the foregoing description, a dynamic semiconductor memory device is described in JP-A-7-93971. The semiconductor memory device disclosed in JP-A-7-93371 comprises a refresh address generator circuit for generating refresh addresses at a constant period, and a storage unit for storing refresh addresses which are classified into two or more types based on a set of bits indicative of the shortest pause time in the refresh addresses. This semiconductor memory device omits refresh operations in unnecessary cycles for those refresh addresses which belong to a class of refresh addresses that have pause times twice or more longer than the refresh address having the shortest pause time. In this way, unnecessary refresh operations at shorter periods are omitted for each address to reduce the power which would be otherwise consumed by the refresh operations.

In a semiconductor device disclosed in JP-A-11-39862, a row is selected at a period shorter than a period at which an external signal change. The semiconductor device has a test oscillator circuit which oscillates at a period shorter than a refresh oscillator circuit, which specifies the period of self-refresh operation, to generate an internal row address strobe signal. Upon selection of a special operation mode, the test oscillator circuit is activated by an external row address strobe signal (/RAS) to provide a row control circuit with the internal row address strobe signal through a selector. In this way, the internal row address strobe signal is generated at a period shorter than the period of the row address strobe signal /RAS to select a row.

In a semiconductor memory device disclosed in JP-A-11-120772, a bias voltage generator has a self-refresh function which automatically refreshes data in memory cells. The bias voltage generator is intermittently activated by an activation signal only when the refresh function is active. After activated by the activation signal, a self-refresh operation is periodically performed twice or more. In this way, a bias circuit intermittently operates in a self-refresh mode to reduce the proportion of a waiting time and additionally realize a reduction in a current consumed thereby.

A self-refresh circuit disclosed in JP-P2000-315385A comprises a binary counter circuit, a selector circuit, and a set/reset signal generator circuit. The selector circuit receives an external address signal and an output signal of the binary counter circuit, and delivers the external address signal as an internal address signal during a read/write cycle period. The selector circuit in turn delivers the output signal of the binary counter circuit as an internal address signal during a self-refresh period. The set/reset signal generator circuit generates a set/reset signal based on the external address signal. The binary counter circuit delivers an output signal which sequentially indicates addresses continuous to an address indicated by the external address signal, based on the set/reset signal, during the self-refresh period.

A self-refresh control circuit disclosed in JP-P2001-6356A can eliminate an intensive refresh operation for all words after a self-refresh operation to reduce excessive current consumption. A timer circuit indicates a predetermined operation timing. An internal binary counter operates at a timing indicated by the timer circuit to determine a row address for use in the self-refresh operation. A counter comparator compares the value on the internal binary counter at the start of a self-refresh operation with the value on the internal binary counter during the execution of the self-refresh operation. When the value of the internal binary counter during the execution of the self-refresh operation coincides with the value at the start of the self-refresh operation, the counter comparator delivers a predetermined potential to an external I/O terminal, showing that the intensive refresh operation is not required.

A semiconductor memory circuit described in JP-P2001-283586A achieves a sufficient level of restore even when it uses a self-refresh operation which requires low current consumption. A delay amount switching circuit block switches a delay amount of an RTO signal, which defines deactivation of word lines in a self-refresh operation, to delay the RTO signal. The delay amount switching circuit block includes a path selector circuit which selects a signal path B for a CBR refresh operation and a signal path A for a self-refresh operation. The RTO signal is delayed by a predetermined time through the signal path A in the self-refresh operation. As a result, a row address strobe signal $\overline{RAS}$ remains active for a longer period to extend a word line selection period. In the CBR refresh operation, the signal path B is selected so that the RTO signal is not delayed. In this way, the waveform of signal $\overline{RAS}$ is adjusted in accordance with the length of the refresh operation cycle to achieve an appropriate level of restore.

SUMMARY OF THE INVENTION

It is an object of the present invention to provide a semiconductor memory device which is capable of reducing the frequency of a CBR refresh operation.

It is another object of the present invention to provide a semiconductor memory device which is capable of achieving a reduction in current required for the CBR refresh operation.

It is a further object of the present invention to provide a semiconductor memory device which is capable of reducing the frequency of the CBR refresh operation by a factor of m, where m is an integer equal to or more than two, based on the hold characteristic of memory cells.

According to a first aspect of the present invention, a semiconductor memory device includes a memory cell array having a plurality of memory cells, and a CBR refresh unit responsive to m receptions of CBR (column before row) refresh commands for performing one refresh operation for the memory cell array, where m is an integer equal to or more than two.

According to a second aspect of the present invention, a semiconductor memory device includes a memory cell array having a plurality of memory cells, and a CBR refresh unit responsive to m receptions of CBR (column before row) refresh commands for performing a refresh operation once for each of the plurality of memory cells in the memory cell array, where m is an integer equal to or more than two.

According to a third aspect of the present invention, a semiconductor memory device includes a memory cell array having a plurality of memory cells and m array units, where m is an integer equal to or more than two, and a CBR refresh unit responsive to m receptions of CBR (column before row) refresh commands for performing a refresh operation once for each of the m arrays.

According to a fourth aspect of the present invention, a semiconductor memory device includes a plurality of memory cells, and control means for controlling execution of a CBR (column before row) refresh command based on a data holding time of each of the plurality of memory cells.

The present invention relates to a CBR refresh operation, regarded as distinct from a self-refresh operation, which involves the execution of a memory refresh operation in response to a command from the outside of the memory. In the present invention, one of m CBR refresh commands from the outside, particularly, one of two CBR refresh commands is validated. In other words, the operation involved in the CBR refresh command is reduced to one-half.

It is possible to program in the semiconductor memory device (for example, DRAM) as to whether or not the CBR refresh operations are reduced to one-half. Therefore, this setting for the reduction of the CBR refresh operations to one-half may not be selected for such a semiconductor memory device which holds data in memory cells for a time too short to experience possible malfunctions due to such setting, as determined from the result of a holding time test.

Conversely, the setting for the reduction of the CBR refresh operations to one-half can be selected for a semiconductor memory device (i.e., DRAM) which has a longer holding time than a reference value, as determined in the result of a holding time test, when an initial setting during the manufacturing of the semiconductor memory device is set as before such that the internal CBR refresh operation is performed once per CBR refresh command. A current required for the CBR refresh operation can be reduced to one-half by invalidating every other CBR refresh command applied from the outside. The current consumed by the operation involved in the CBR refresh command is mainly required for activating word lines, amplifying small signals on bit lines, charging or discharging the bit lines to a desired level, and subsequently resetting the word lines in the semiconductor memory device. Therefore, the current consumption can be reduced to approximately one-half by reducing the frequency of these operations to one-half. It goes without saying that a reduction in consumed current is a critical concern which is required at all times because such reduction leads to improvements on the characteristics of a device which is provided with the semiconductor memory device.

A reduction of current consumption to one-half, which means that heat generated by the semiconductor memory device is also reduced to one-half, can advantageously mitigate the rising temperature within the semiconductor memory device, extend a holding time of memory cells, thereby limiting a rise in the temperature inside of an apparatus which is provided with the semiconductor memory device, as well as a rise in the temperature within the semiconductor memory device, to prevent malfunctions of the associated apparatus.

Thus, the present invention is effective to memories which are incorporated in portable apparatuses, and memories which are incorporated in apparatuses, such as a large scaled server, which confront a technical challenge of reducing a current consumed thereby.

The above and other objects, features, and advantages of the present invention will become apparent from the following description with reference to the accompanying drawings which illustrate an example of the present invention.

BRIEF DESCRIPTION OF THE DRAWINGS

FIGS. 2A and 2B are block diagrams illustrating the circuit configuration of a program control circuit and a skip control circuit, respectively, which are provided in the semiconductor memory device illustrated in FIG. 1;

FIGS. 3A to 3C are waveform charts showing the state of a flag signal FG when a fuse is cut in the semiconductor memory device illustrated in FIG. 1;

FIGS. 3D to 3F are waveform charts showing the state of a flag signal FG when the fuse is not cut in the semiconductor memory device illustrated in FIG. 1;

FIGS. 4A to 4J are timing charts showing the operation of various components when the fuse is cut in the semiconductor memory device illustrated in FIG. 1;

DETAILED DESCRIPTION OF THE INVENTION

Figure 1:
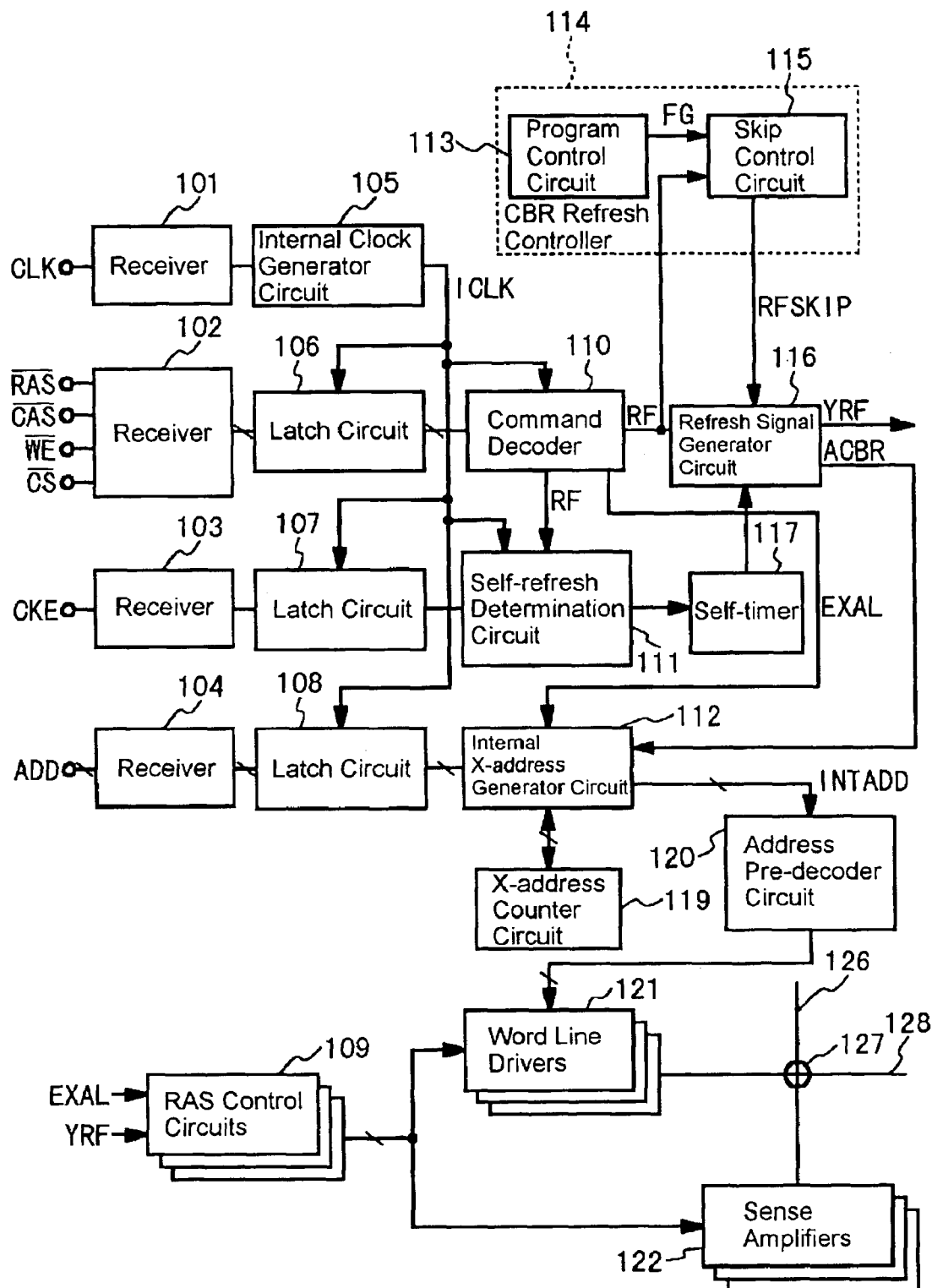
FIG. 1 is a block diagram illustrating the circuit configuration of a semiconductor memory device according to a first embodiment of the present invention.

A semiconductor memory device illustrated in FIG. 1 according to a first embodiment of the present invention comprises a memory cell array which includes a plurality of memory cells 127 for which a refresh operation is performed. The semiconductor memory device comprises four receivers 101 to 104; internal clock generator circuit 105;

three latch circuits 106 to 108; a group of RAS (row address strobe) control circuits 109; and CBR (column before row) refresh controller 114. The semiconductor memory device further comprises command decoder 110; self-refresh determination circuit 111; internal X-address generator circuit 112; X-address counter circuit 119; refresh signal generator circuit 116; self-timer 117; address pre-decoder circuit 120; a group of word line drivers 121; a group of sense amplifiers 122; and memory cells 127.

Here, CBR refresh controller 114 comprises program control circuit 113 and skip control circuit 115. A fuse element is incorporated in program control circuit 113.

Receiver 101 receives external clock signal CLK which is then applied to internal clock generator circuit 105. In response to signal CLK, internal clock generator circuit 105 generates internal clock signal ICLK which is applied to latch circuits 106 to 108, command decoder 110, and self-refresh determination circuit 111.

Receiver 102 receives row address strobe signal $\overline{RAS}$, column address strobe signal $\overline{CAS}$, write enable signal $\overline{WE}$, and chip select signal $\overline{CS}$, and applies latch circuit 106 with these signals themselves or the result of a logical operation performed on these signals. In response to internal clock signal ICLK, latch circuit 106 latches the output from receiver 102 and applies the same to command decoder 110.

Receiver 103 receives clock enable signal CKE which is then applied to latch circuit 107. In response to internal clock signal ICLK, latch circuit 107 latches the output from receiver 103, and applies the same to self-refresh determination circuit 111.

Receiver 104 receives external address signal ADD which is then applied to latch circuit 108. In response to internal clock signal ICLK, latch circuit 108 latches the output from receiver 103, and applies the same to internal X-address generator circuit 112.

Command decoder 110 decodes the output of latch circuit 106 to generate refresh signal RF and address control signal EXAL. Signal EXAL is not generated for a CBR refresh command, but is generated for a self-refresh command. Refresh signal RF is supplied to self-refresh determination circuit 111, refresh signal generator circuit 116, and skip control signal 115. Address control signal EXAL in turn is supplied to internal X-address generator circuit 112 and RAS control circuits 109.

In response to refresh signal RF, skip control circuit 115 generates refresh skip signal RFSKIP based on flag signal FG from program control circuit 113. Refresh skip signal RFSKIP is applied to refresh signal generator circuit 116. Self-refresh determination circuit 111 determines whether an external command is a CBR refresh command or a self-refresh command based on clock enable signal CKE and refresh signal RF. When an external command is determined to be the self-refresh command, self-refresh determining circuit 111 notifies command decoder 110 of the determination result. Also, in response to internal clock signal ICLK, self-refresh determining circuit 111 generates a timer start signal which is applied to self-timer 117. Self-timer 117 measures the time in response to the timer start signal, and generates an interrupt signal when it reaches a set time. The interrupt signal is applied to refresh signal generator circuit 116.

Refresh signal generator circuit 116 generates refresh instruction signal YRF and address control signal ACBR based on refresh signal RF, the interrupt signal from self-timer 117, and refresh skip signal RFSKIP from skip control circuit 115. Refresh instruction signal YRF is supplied to RAS control circuits 109, while address control signal ACBR is supplied to internal X-address generator circuit 112.

X-address counter circuit 119 updates an internal address based on an instruction from internal X-address generator circuit 112, and applies the updated internal address to internal X-address generator circuit 112. Internal X-address generator circuit 112 generates internal address signal INTADD based on signal EXAL from command decoder 110 or address control signal ACBR from refresh signal generator circuit 116, the external address signal from latch circuit 108, and the updated address from X-address counter circuit 119. Internal address signal INTADD is supplied to address pre-decoder circuit 120. Address pre-decoder circuit 120 pre-decodes internal address signal INTADD, and supplies the resulting signal to word line drivers 121.

Each of RAS control circuits 109 generates a driving signal in response to signal EXAL from command decoder 110 or refresh instruction signal YRF to drive associated word line driver 121 and sense amplifier 122. Word line drivers 121 drive word lines 128 based on the address from address pre-decoder circuit 120. Bit lines 126 are also driven to access memory cells 127 within the memory cell array. Signals from memory cells 127 are amplified by sense amplifiers 122, and written again into memory cells 127. In this way, the refresh operation is performed. In the CBR refresh operation, word line drivers 121 and sense amplifiers 122 are released from their activated state at a timing at which the refresh operation is completed for memory cells 127.

Referring next to FIGS. 2A and 2B, CBR refresh controller 114 will be described in greater detail. FIG. 2A illustrates the circuit configuration of program control circuit 113, and FIG. 2B illustrates the circuit configuration of skip control circuit 115.

As illustrated in FIG. 2A, program control circuit 113 comprises fuse 502, NAND circuit G1, transistor Tr1, and inverters IN1, IN2. Fuse 502 has one end connected to power supply VDD and the other end connected to the ground through transistor Tr1. NAND circuit G1 has one input terminal connected to the other end of fuse 502, and the other input terminal supplied with signal PONV. Inverters IN1, IN2 are connected in series with the output of NAND circuit G1 which is also connected to a gate of transistor Tr1. The output of inverter IN2 is flag signal FG. In program control circuit 114, the level of flag signal FG is determined depending on whether or not fuse 502 is cut in a steady state. Flag signal FG is at low level when fuse 502 is not cut, and at high level when fuse 502 is cut.

Referring now to FIGS. 3A to 3C, description will be made on flag signal FG when fuse 502 is cut. As shown in FIG. 3A, when fuse 502 is cut, power supply voltage VDD gradually increases after power-on. In this event, since a low voltage appears at the grounded end of fuse 502, the output of NAND circuit G1 is at high level. This causes flag signal FG to increase following the increasing power supply voltage VDD, as shown in FIG. 3C. As power supply voltage VDD reaches or exceeds a certain voltage, signal PONV transitions to high level, as shown in FIG. 3B. This causes transistor Tr1 to turn on to further reduce the voltage at the grounded end of fuse 502, resulting in a transition of the output of NAND circuit G1 to high level. This high level output is delivered through inverters IN1, IN2 as flag signal FG.

Referring next to FIGS. 3D to 3F, description will be made on flag signal FG when fuse 502 is not cut. As shown in FIG. 3D, power supply voltage VDD gradually increases after power-on. In this event, although the voltage increases at the terminal of NAND circuit G1 connected to fuse 502 because fuse 502 is not cut, the output of NAND circuit G1 is at high level due to signal PONV at low level. This causes flag signal FG to increase following the increasing power supply voltage, as shown in FIG. 3F. As power supply voltage VDD reaches or exceeds a certain voltage, signal PONV transitions to high level, as shown in FIG. 3E. This causes the output of NAND circuit G1 to transition to low level. This low level output is delivered through inverters IN1, IN2 as flag signal FG.

As illustrated in FIG. 2B, skip control circuit 115 comprises NAND circuits G2, G3; transfer gates T1, T2; and inverters IN3 to IN9. Here, inverters IN5, IN6 make up a first latch, while inverters IN7, IN8 make up a second latch. A circuit composed of transfer gates T1, T2, first and second latches, and inverter IN4 functions as a counter. NAND circuit G2 is applied with refresh signal RF and flag signal FG, and inverter IN3 is connected to the output of NAND circuit G2. Each of transfer gates T1, T2 is controlled by the output of NAND circuit G2 and the output of inverter IN3 which inverts the output of NAND circuit G2. The first latch comprised of inverters IN5, IN6 is connected between transfer gates T1, T2, and the second latch comprised of inverters IN7, IN8 is further connected to the other end of transfer gate T2. The second latch has the other terminal connected to one end of transfer gate T1 through inverter IN4 and also connected to one input terminal of NAND circuit G3. NAND circuit G3 is supplied with flag signal FG at the other input terminal. The output of NAND circuit G2 is supplied to refresh signal generator circuit 116 through inverter IN9 as refresh skip signal RFSKIP.

When flag signal is at low level, i.e., when fuse 502 is not cut, the output of NAND circuit G3 is always at high level so that signal RFSKIP is at low level.

On the other hand, when flag signal FG is at high level, i.e., when fuse 502 is not cut, the level of signal RFSKIP depends on the output of the second latch which is comprised of inverters IN7, IN8. When the output of the second latch is at high level, the output of inverter IN4 is at low level. In this event, the output of the first latch comprised of inverters IN5, IN6 is at low level. Since flag signal FG is at high level, a transition of signal RF to high level causes the output of NAND circuit G2 to go to low level. Thus, transfer gate T1 is turned on, while transfer gate T2 is turned off by the outputs of NAND circuit G2 and inverter IN3. As a result, the low level output of inverter IN4 is latched in the first latch. Next, as signal RF transitions from high level to low level, this causes transfer gate T1 to turn off and transfer gate T2 to turn on. Consequently, the output of the first latch transitions to high level because of the low level output of inverter IN4. Since transfer gate T2 is turned on, the output of the second latch is at low level. In this way, each time signal RF is applied, output signal RFSKIP alternates between high level and low level.

Stated another way, in the circuit illustrated in FIG. 2B, the circuit including the first latch comprised of inverters IN5, IN6 and the second latch comprised of inverters IN7, IN8 acts as a toggle switch or a counter to validate one of two CBR refresh commands. However, as the number of latch stages is increased, the circuit acts as an arbitrary counter which can validate one of m CBR refresh commands, where m is an integer equal to or more than two.

Next, description will be made on the operation of the semiconductor memory device according to the first embodiment. FIGS. 4A to 4J show waveforms at various components of the semiconductor memory device. Assume herein that fuse 502 is cut so that signal FG remains at high level, as shown in FIG. 4A.

When the semiconductor memory device is a synchronous memory, receiver 101 is applied with external clock signal CLK from the outside, as shown in FIG. 4B. Internal clock generator circuit 105 generates internal clock signal ICLK from external clock signal CLK. Also, as shown in FIG. 4C, clock enable signal CKE at high level is supplied to receiver 103. In response to internal clock signal ICLK, latch circuit 107 latches signal CKE which is then applied to self-refresh determination circuit 111. As shown in FIG. 4E, receiver 102 is applied with command signal CMD ($\overline{RAS}$, $\overline{CAS}$, $\overline{WE}$) for giving operational instructions for the semiconductor memory device in synchronization with clock signal CLK. Latch circuit 106 latches command signal CMD at a timing at which internal clock signal ICLK transitions from low level to high level, and then applies command signal CMD to command decoder 110. In this event, command signal CMD is commonly applied to a plurality of semiconductor memory devices, it is necessary to identify a single semiconductor memory device to which command signal CMD is directed. Thus, as shown in FIG. 4D, each semiconductor memory device is applied with chip select signal $\overline{CS}$. When chip select signal $\overline{CS}$ is at low level, an associated semiconductor memory device fetches command signal CMD at the aforementioned timing. Command decoder 110 generates refresh signal RF and signal EXAL based on command signal CMD. Refresh signal RF is supplied to skip control circuit 115 of CBR refresh controller 114, refresh signal generator 116, and self-refresh determination circuit 111.

Assume herein that a refresh command is applied. Nevertheless, there are two types of refresh commands which should be taken into account in this embodiment: a CBR refresh command and a self-refresh command. Though the same command signal CMD is generated for both the CBR refresh and self-refresh commands, they are distinguished by the state of clock enable signal CKE. Specifically, an applied refresh command is determined to be a CBR refresh command when clock enable signal CKE is at high level, and a self-refresh command when clock enable signal CKE is at low level. FIG. 4E shows the CBR refresh command.

Self-refresh determination circuit 111 receives clock enable signal CKE from latch circuit 107, and determines that refresh signal RF is a CBR refresh command when signal CKE is at high level, as shown in FIG. 4C. In this event, no timer start signal is applied to self-timer 117. When self-refresh determination circuit 111 determines that refresh signal RF is a self-refresh command, the timer start signal is applied to self-timer 117. Self-timer 117, in response to the timer start signal, starts measuring the time, and generates an interrupt signal when it reaches a set time. The interrupt signal is applied to refresh signal generator circuit 116. For the self-refresh command, refresh signal generator circuit 116 is controlled by the output from self-timer 117.

On the other hand, for the CBR refresh command associated with this embodiment, refresh signal generator circuit 116 is driven by refresh signal RF which is applied thereto each time a CBR refresh command arrives, to control signals YRF, ACBR. As previously described with reference to FIGS. 2A and 2B, CBR refresh controller 114 delivers refresh skip signal RFSKIP which is inverted each time refresh signal RF is applied thereto. As shown in FIGS. 4F and 4G, refresh skip signal RFSKIP changes in level each time refresh signal RF transitions from high level to low level. In this way, refresh signal generator circuit 116 is switched between a valid state and an invalid state. Refresh signal generator circuit 116 ignores refresh signal RF from command decoder 110 in the invalid state, and operates based on refresh signal RF in the valid state. However, skip control circuit 115 performs this operation only when signal FG at high level is applied from program control circuit 113 to skip control circuit 115. With the self-refresh command, signal RFSKIP is masked by the signal from self-timer 117, and therefore refresh signal generator circuit 116 is disabled.

As shown in FIGS. 4G to 4I, refresh signal generator circuit 116 generates signal ACBR, when signal RFSKIP is a low level, as a refresh instruction signal, which is required to change signal YRF and internal X-address. Signal YRF is needed to refresh memory cells in the semiconductor memory device.

Commands include a so-called active command which activates a memory cell at a desired address before a read (i.e., read command) or a write (i.e., write command) is performed in the semiconductor memory device. In the circuit illustrated in FIG. 1, in response to the active command, signal EXAL is generated from command decoder 110 and applied to internal X-address generator circuit 112 and RAS control circuits 109. Signal EXAL is not generated in response to the CBR refresh command.

When the CBR refresh command is applied, signal ACBR generated from refresh signal generator circuit 116 is supplied to internal X-address generator circuit 112. In response to signal ACBR, internal X-address generator circuit 112 increments the X-address (INTADD) and delivers the incremented X-address. The increment operation is processed in X-address counter circuit 119, and incremented internal address INTADD is transferred from internal X-address generator circuit 112 to address pre-decoder circuit 120. Address pre-decode circuit 120 decodes internal address INTADD, and applies decoded internal address INTADD to word line drivers 121.

In response to signal YRF generated from refresh signal generator circuit 116, RAS control circuits 109 activates associated word line drivers 121 and sense amplifiers 122. However, it is only some of word line drivers 121 selected by the pre-decoded address that are activated. Signals in memory cells 127 connected to activated word lines are amplified by associated sense amplifiers 122, and again stored in memory cells 127. This sequence of operations corresponds to the refresh operation. In the CBR refresh operation, word line drivers 121 and sense amplifiers 122 are released from their activated states at the timing at which memory cells are refreshed. However, since this operation is not directly related to the discussion of the present invention, detailed description thereon is omitted here.

In the semiconductor memory device according to the first embodiment, a current consumed by the CBR refresh command operation is mainly required for activating word lines, amplifying small signals on bit lines, charging or discharging the bit lines to a desired level, and subsequently resetting the word lines. Therefore, the current consumption can be reduced by reducing the frequency of these operations to one-half. A reduction in consumed current is a critical concern which is required at all times because such reduction leads to improvements on the characteristics of an apparatus which is provided with the semiconductor memory device. Also, a reduction of current consumption to one-half means that heat generated by the semiconductor memory device is also reduced to one-half. The reduction of generated heat to one-half can mitigate the rising temperature within the semiconductor memory device, extend a holding time of memory cells, thereby limiting a rise in the temperature inside of an apparatus which is provided with the semiconductor memory device, as well as the temperature within the semiconductor memory device, to prevent malfunctions of the associated apparatus.

Figure 5:
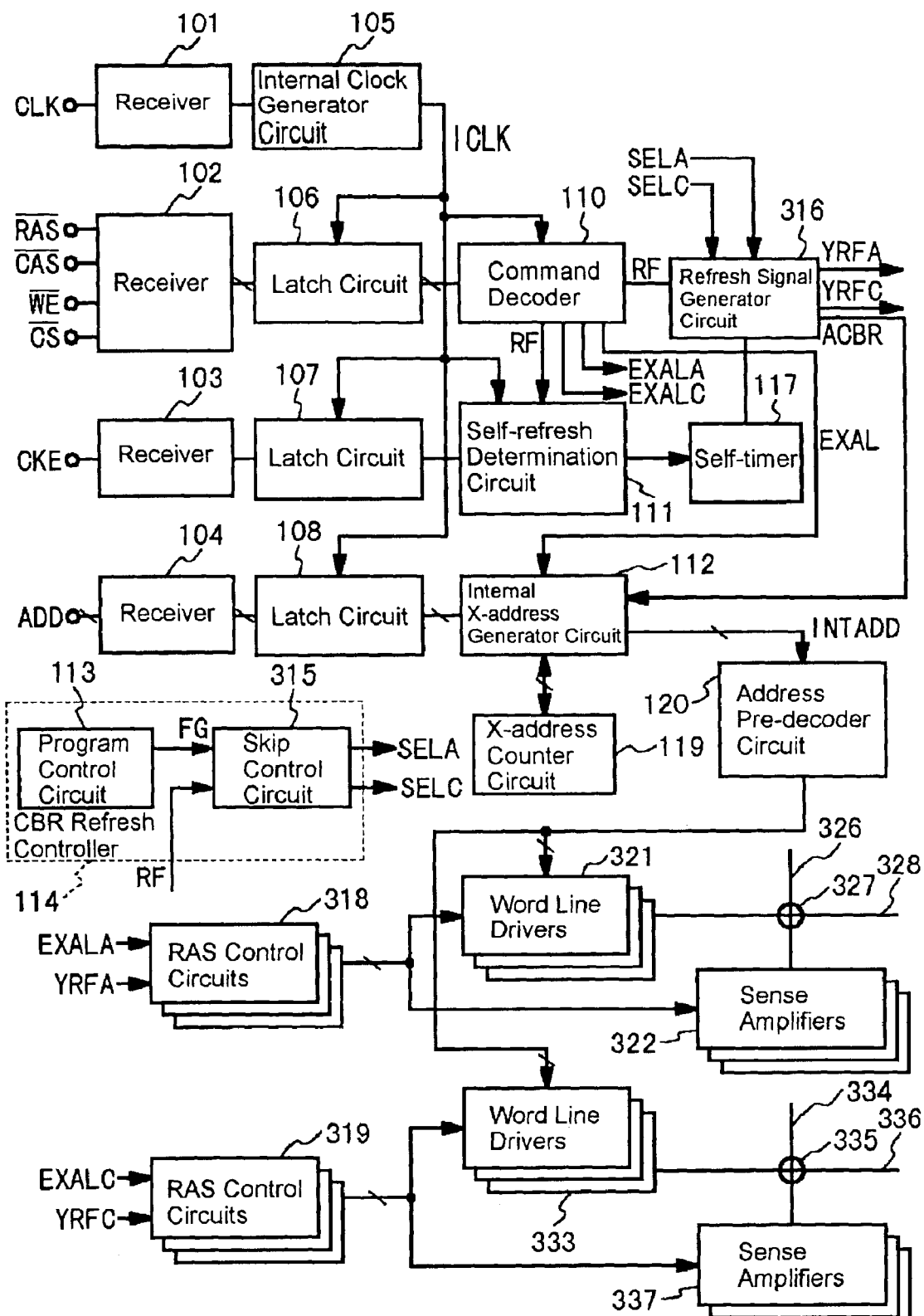
FIG. 5 is a block diagram illustrating the circuit configuration of a semiconductor memory device according to a second embodiment of the present invention.

Next, description will be made on a semiconductor memory device according to a second embodiment of the present invention. The semiconductor memory device according to the second embodiment illustrated in FIG. 5 is similar in basic configuration to the semiconductor memory device illustrated in FIG. 1. A difference between the two embodiments lies in that the RAS control circuits shown in FIG. 1 is separated into two groups which are provided with associated groups of word line drivers 321, 333 and sense amplifiers 322, 337, respectively. Also, command decoder 110 generates signals EXALA, EXALC in addition to refresh signal RF and signal EXAL, and supplies these signals to RAS control circuits 318, 319, respectively. Skip control circuit 315 in CBR refresh controller 114 alternately delivers two signals SELA, SELC. Refresh signal generator circuit 316 generates signals YRFA, YRFC which are supplied to RAS control circuits 318, 319, respectively. In the semiconductor memory device according to the second embodiment, the remaining circuit configuration is identical to that illustrated in FIG. 1.

Figure 6:
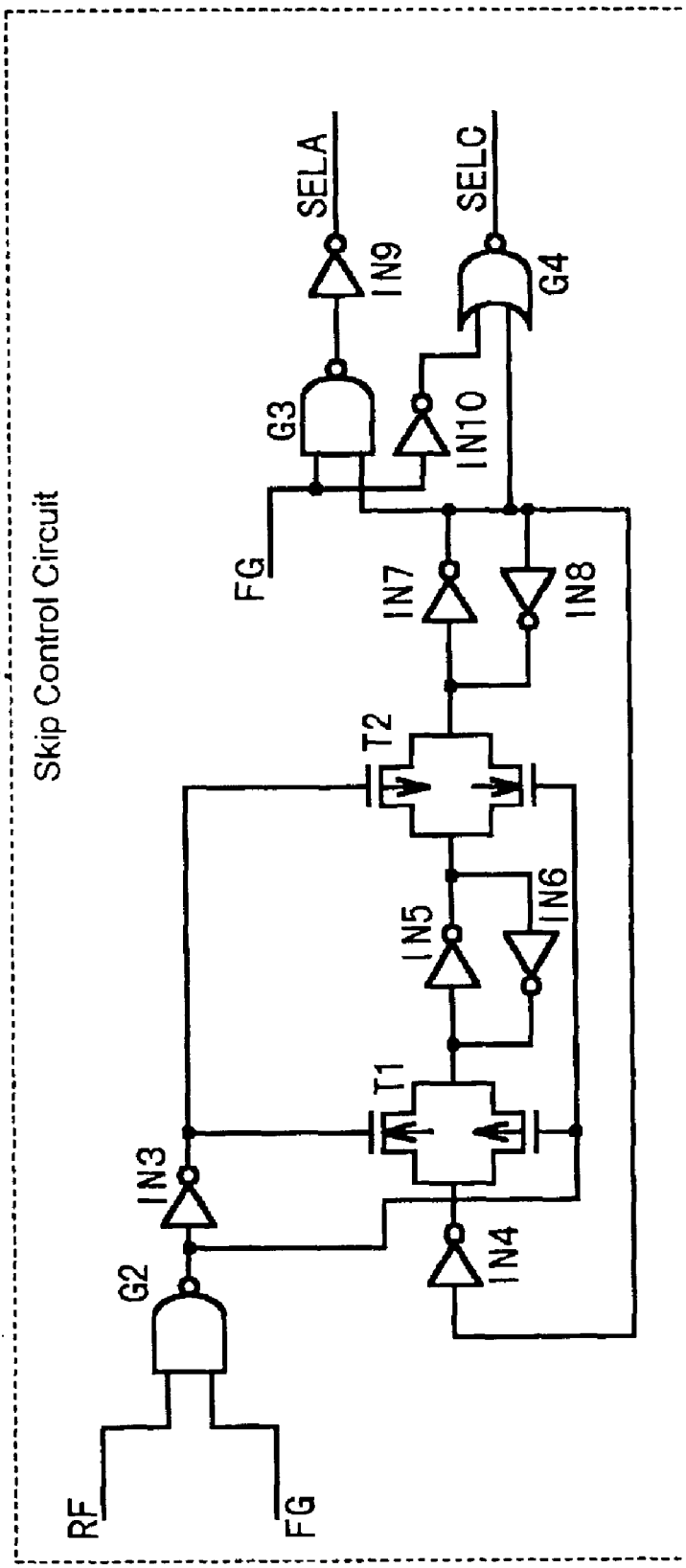
FIG. 6 is a block diagram illustrating the circuit configuration of a skip control circuit provided in the semiconductor memory device illustrated in FIG. 5.

Skip control circuit 315 is similar in circuit configuration to skip control circuit 115 illustrated in FIG. 2B, but differs in that inverter IN10 and NOR circuit G4 are added, as illustrated in FIG. 6. Inverter IN10 inverts flag signal FG, and supplies inverted flag signal FG to one input terminal of NOR circuit G4. The other input terminal of NOR circuit G4 is supplied with the output of a second latch comprised of inverters IN7, IN8. Inverter IN9 delivers signal SELA, while NOR circuit G4 delivers signal SELC. When signal FG is at low level, signals SELA, SELC are both fixed at low level. Signal ACBR is generated once each time refresh signal generator circuit 316 is applied with signal RF twice. This means that the overall address spaces, divided into two, are refreshed one by one.

Figure 7:
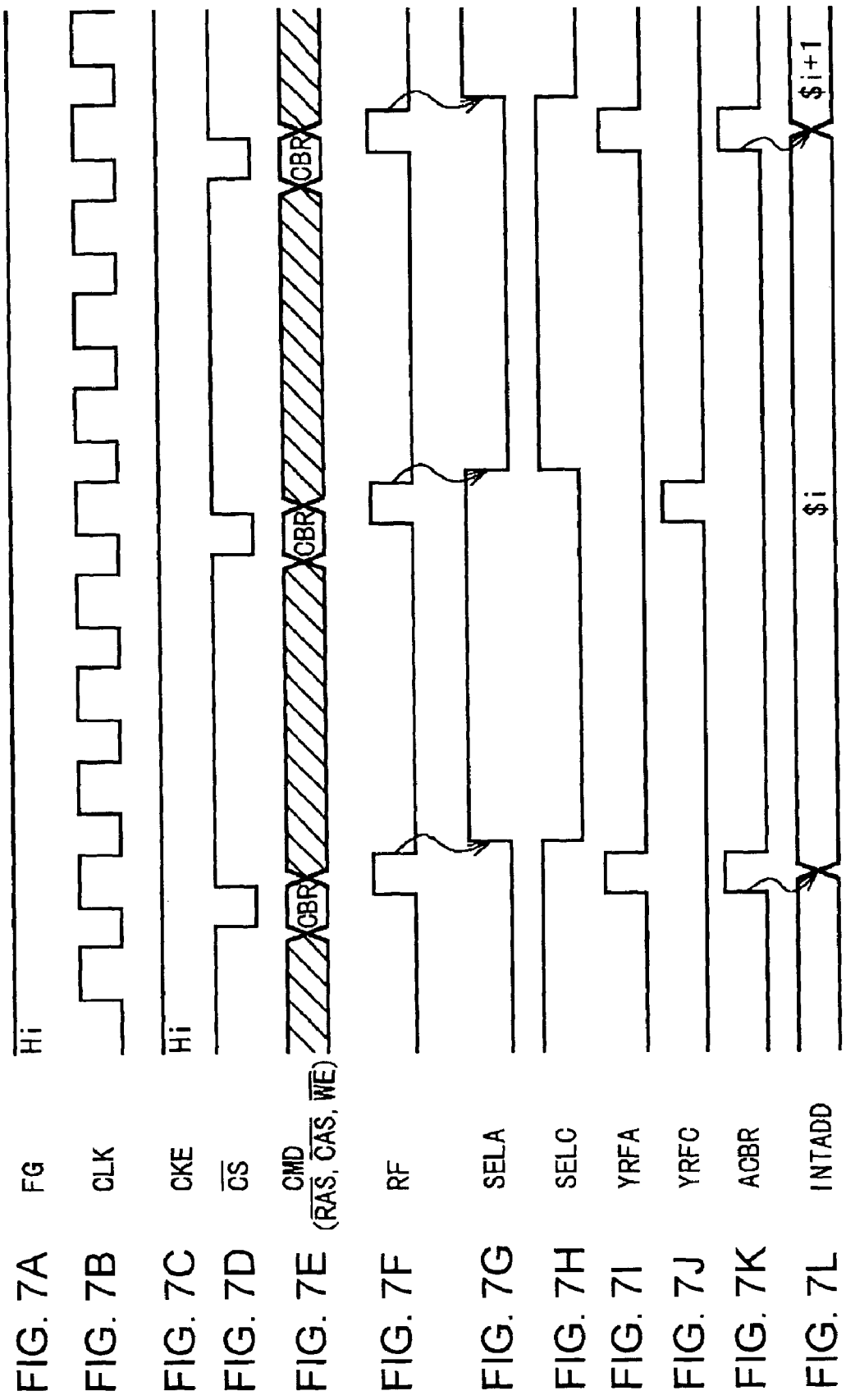
FIGS. 7A to 7L are timing charts showing the operation of various components when a fuse is cut in the semiconductor memory device illustrated in FIG. 5.

Referring next to FIGS. 7A to 7L, description will be made on the operation of the semiconductor memory device according to the second embodiment. Assume herein that fuse 502 is cut, so that signal FG remains at high level, as shown in FIG. 7A.

When the semiconductor memory device is a synchronous memory, receiver 101 is applied with external clock signal CLK from the outside, as shown in FIG. 7B. Internal clock generator circuit 105 generates internal clock signal ICLK from external clock signal CLK. Also, as shown in FIG. 7C, clock enable signal CKE at high level is supplied to receiver 103. In response to internal clock signal ICLK, latch circuit 107 latches signal CKE which is then applied to self-refresh determination circuit 111. Further, as shown in FIG. 7E, receiver 102 is applied with command signal CMD ($\overline{RAS}$, $\overline{CAS}$, $\overline{WE}$) for giving operational instructions for the semiconductor memory device in synchronization with clock signal CLK. Latch circuit 106 latches command signal CMD at a timing at which internal clock signal ICLK transitions from low level to high level, and then applies command signal CMD to command decoder 110. In this event, command signal CMD is commonly applied to a plurality of semiconductor memory devices, it is necessary to identify a single semiconductor memory device to which command signal CMD is directed. Thus, as shown in FIG. 7D, each semiconductor memory device is applied with chip select signal $\overline{CS}$. When chip select signal $\overline{CS}$ is at low level, an associated semiconductor memory device fetches command signal CMD at the aforementioned timing.

Command decoder 110 generates refresh signal RF and signals EXAL, EXALA, EXALC based on command signal CMD. Refresh signal RF is supplied to skip control circuit 315 of CBR refresh controller 114, refresh signal generator 316, and self-refresh determination circuit 111.

Assume herein that a refresh command is applied. Nevertheless, there are two types of refresh commands which should be taken into account in this embodiment: a CBR refresh command and a self-refresh command. Though the same command signal CMD is generated for both the CBR refresh and self-refresh commands, they are distinguished by the state of clock enable signal CKE. Specifically, an applied refresh command is determined to be a CBR refresh command when clock enable signal CKE is at high level, and to be a self-refresh command when clock enable signal CKE is at low level. FIG. 7E shows the CBR refresh command.

Self-refresh determination circuit 111 receives clock enable signal CKE from latch circuit 107, and determines that refresh signal RF is a CBR refresh command when signal CKE is at high level, as shown in FIG. 7C. In this event, no timer start signal is applied to self-timer 117. When self-refresh determination circuit 111 determines that refresh signal RF is a self-refresh command, the timer start signal is applied to self-timer 117. Self-timer 117, in response to the timer start signal, starts measuring the time, and generates an interrupt signal when it reaches a set time. The interrupt signal is applied to refresh signal generator circuit 316. For the self-refresh command, refresh signal generator circuit 316 is controlled by the output from self-timer 117.

On the other hand, for the CBR refresh command, refresh signal generator circuit 316 is driven by refresh signal RF which is applied thereto each time a CBR refresh command arrives, to generate signals YRFA, YRFC and address control signal ACBR. Here, as shown in FIGS. 7H and 7I, CBR refresh controller 114 alternately delivers signals SELA, SELC as refresh skip signals each time refresh signal RF is applied thereto. Also, as shown in FIG. 7K, refresh signal generator circuit 316 generates signal ACBR once each time refresh signal RF is applied twice. In this way, each of outputs YRFA, YRFC from refresh signal generator circuit 316 are switched between a valid state and invalid state. Refresh signal generator circuit 316 ignores refresh signal RF from command decoder 110 in the invalid state, and operates based on refresh signal RF in the valid state. However, skip control circuit 315 performs this operation only when signal FG at high level is applied from program control circuit 113 to skip control circuit 315. With the self-refresh command, refresh skip signals SELA, SELC are masked by the signal from self-timer 117, and therefore refresh signal generator circuit 316 is disabled.

As shown in FIGS. 7I to 7K, refresh signal generator circuit 316 generates signal ACBR, as a refresh instruction signal, which is required to change signals YRFA, YRFC and internal X-address. Signals YRFA, YRFC are needed to refresh memory cells in the semiconductor memory device.

Commands include a so-called active command which activates a memory cell at a desired address before a read or a write is performed in the semiconductor memory device. In the circuit illustrated in FIG. 5, in response to the active command, signals EXAL, EXALA, EXALC are generated from command decoder 110. Signal EXAL is applied to internal X-address generator circuit 112 and signals EXALA, EXALC are applied to RAS control circuits 318, 319, respectively. Signals EXAL, EXALA, EXALC are not generated in response to the CBR refresh command.

When the CBR refresh command is applied, signal ACBR generated from refresh signal generator circuit 316 is supplied to internal X-address generator circuit 112. In response to signal ACBR, internal X-address generator circuit 112 increments the X-address (INTADD) and delivers the incremented X-address. The increment operation is processed in X-address counter circuit 119, and incremented internal address INTADD is transferred from internal X-address generator circuit 112 to address pre-decoder circuit 120. Address pre-decode circuit 120 decodes internal address INTADD, and applies decoded internal address INTADD to word line drivers 121.

In response to signals YRFA, YRFC generated from refresh signal generator circuit 316, RAS control circuits 318, 319 activate associated word line drivers 321, 333 and sense amplifiers 322, 337, respectively. However, it is only some of word line drivers 321, 333 which are selected by pre-decoded addresses. Signals in memory cells 327, 335 connected to activated word lines are amplified by sense amplifiers 322, 327, respectively, and stored again in memory cells 327, 335. This sequence of operations corresponds to the refresh operation. In the CBR refresh operation, word line drivers 321, 333 and sense amplifiers 322, 337 are released from their activated states at the timing at which memory cells 327, 335 have been refreshed. However, since this operation is not directly related to the discussion of the present invention, detailed description thereon is omitted here.

In the semiconductor memory device illustrated in FIG. 5, the internal refresh operation is performed without exception in response to the CBR refresh command from the outside, wherein the number of memory cells refreshed by the output of skip control circuit 315 is reduced to one-half of those in the semiconductor memory device illustrated in FIG. 1. As previously described, since a majority of consumed current associated with the CBR refresh operation is directed to the memory cell refresh operation, the second embodiment advantageously reduces the current consumed by the CBR refresh operation to one-half, as it the case with the semiconductor memory device according to the first embodiment.

A current consumed by the CBR refresh command operation is mainly required for activating word lines, amplifying small signals on bit lines, charging or discharging the bit lines to a desired level, and subsequently resetting the word lines in the semiconductor memory device. Therefore, the current consumption can be reduced by reducing the frequency of these operations to one-half. Likewise, in the second embodiment, the reduction of generated heat to one-half can mitigate the rising temperature within the semiconductor memory device, extend a holding time of memory cells, thereby limiting a rise in the temperature inside of an apparatus which is provided with the semiconductor memory device to prevent malfunctions of the associated apparatus.

Figure 8:
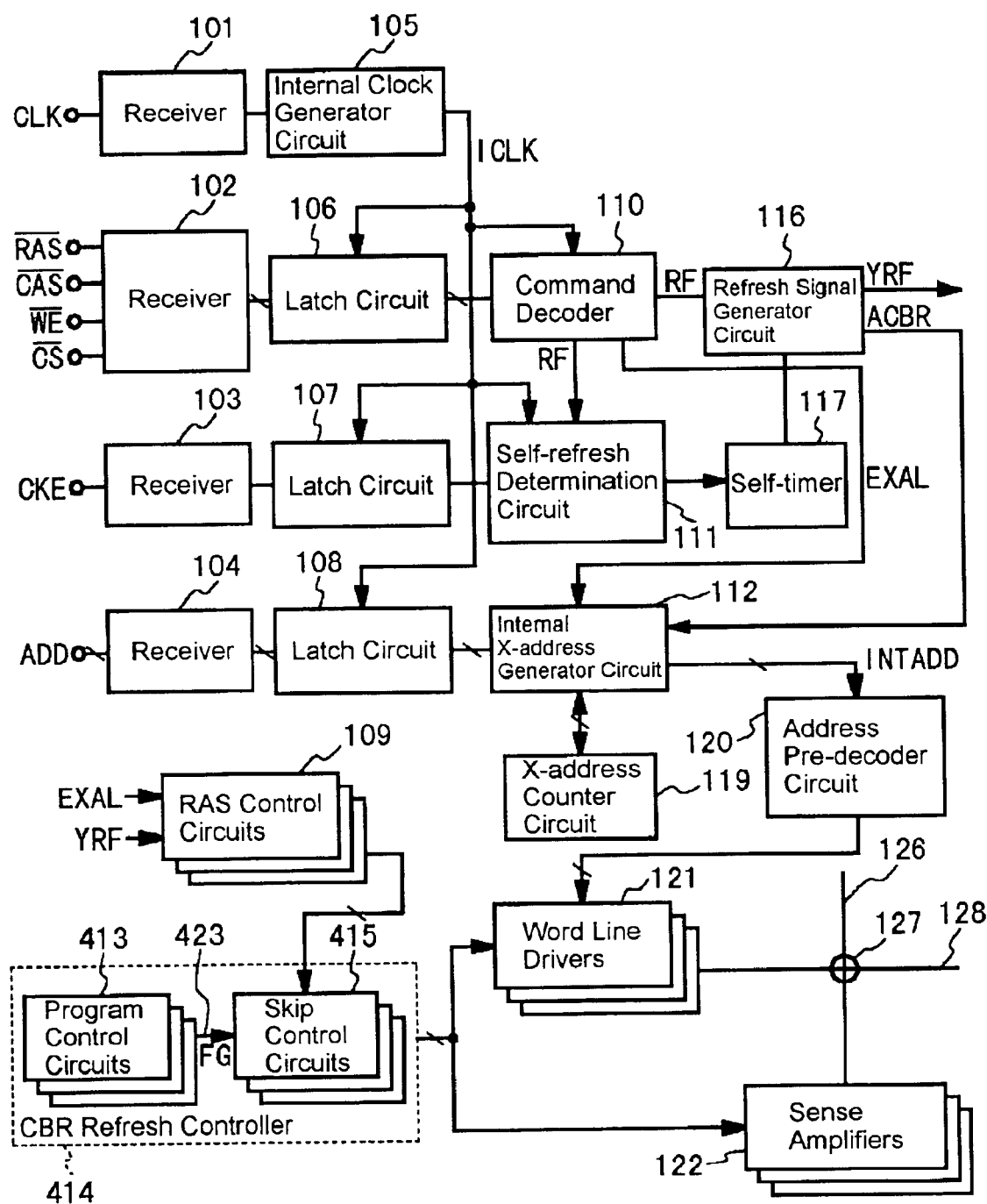
FIG. 8 is a block diagram illustrating the circuit configuration of a semiconductor memory device according to a third embodiment of the present invention.

Next, description will be made on a semiconductor memory device according to a third embodiment of the present invention. The semiconductor memory device according to the third embodiment illustrated in FIG. 8 is similar to the semiconductor memory device illustrated in FIG. 1, but differs in that CBR refresh controller 414 is provided between RAS control circuits 109 and word line drivers 121 and sense amplifiers 122. CBR refresh controller 414 comprises a plurality of program control circuits 413 and a plurality of skip control circuits 415 associated therewith. Each of program control circuits 413 may be implemented by program control circuit 113 illustrated in FIG. 2A. Likewise, each of skip control circuits 415 used herein may be similar to skip control circuit 115 illustrated in FIG. 2B.

In the semiconductor memory device illustrated in FIG. 8, RAS control circuits 109 each generate a selection signal based on signal EXAL or YRF, and apply the selection signal to a plurality of skip circuit circuits 415 associated therewith. Each of the plurality of skip control circuits 415 receives the selection signal from associated one of RAS control circuits 109 in a manner similar to refresh signal RF in the first embodiment, and applies a refresh skip signal to associated ones of word line drivers 121 and sense amplifiers 122. In this way, memory cells 127 are accessed in a manner similar to the first embodiment.

In the foregoing semiconductor memory devices according to the respective embodiments, signal RFSKIP is generated once each time signal RF is applied to the skip control circuit twice. However, it should be easy for those skilled in the art to modify the semiconductor memory device such that signal RFSKIP is generated once each time signal RF is applied to the skip control circuit m times, where m is an integer equal to or more than two. For example, is should be apparent that the latch circuits in the skip control circuit may be replaced with a counter circuit. In this configuration, the memory cell array can be readily divided into an arbitrary number of areas in the semiconductor memory device according to the second embodiment.

Further, the program control circuit illustrated in FIG. 2A can be readily replaced with another form. For example, fuse 502 used in the program control circuit may be a type which is cut by a laser, a type which is electrically fused, a type of capacitive element which is electrically broken, or the like. Alternatively, fuse 502 may be formed of a non-volatile memory device. When a non-volatile memory is used, it can be re-written by a master apparatus not only during a manufacturing process but also in an actual use of the semiconductor memory device.

While a preferred embodiment of the present invention has been described using specific terms, such description is for illustrative purposes only, and it is to be understood that changes and variations may be made without departing from the spirit or scope of the following claims.

What is claimed is:

1. A semiconductor memory devices, comprising:
a memory cell array comprising a plurality of memory cells; and
a CBR refresh unit responsive to m receptions of CBR refresh commands for performing one refresh operation for said memory cell array, wherein m is an integer equal to or more than two, and said CBR refresh unit comprises:
a refresh unit responsive to a refresh instruction signal for performing the refresh operation for said memory cell array;
a refresh instructing unit which ignores the CBR refresh command in an invalid state, said refresh instructing unit responsive to the CBR refresh command for applying the refresh instruction signal to said refresh unit in a valid state; and
a CBR refresh control unit for setting said refresh instructing unit in the valid state once per m receptions of the CBR refresh commands.

2. The semiconductor memory device according to claim 1, wherein said CBR refresh control unit further comprises:
a data holding circuit for holding control data; and
a skip unit responsive to m receptions of the CBR refresh commands for setting said refresh instructing unit once in the valid state based on the control data.

3. The semiconductor memory device according to claim 2, wherein said skip unit sets said refresh instructing unit in the valid state at all times when the control data is not held in said data holding circuit.

4. The semiconductor memory device according to claim 2, wherein said skip unit counts the CBR refresh commands when the control data is held in said data holding circuit, and sets said refresh instructing unit in the valid state once when said skip unit counts the CBR refresh commands m times.

5. The semiconductor memory device according to claim 2, wherein said data holding circuit comprises a fuse, said fuse being cut for holding the control data.

6. The semiconductor memory device according to claim 5, wherein said fuse is cut based on a data holding time of said memory cells.

7. The semiconductor memory device according to claim 2, wherein said data holding circuit comprises a non-volatile memory, said control data being written into said non-volatile memory.

8. The semiconductor memory device according to claim 7, wherein said control data is written into said non-volatile memory based on a data holding time of said memory cells.

9. A semiconductor memory device, comprising:
a memory cell array having a plurality of memory cells; and
a CBR refresh unit responsive to m receptions of CBR refresh commands for performing a refresh operation once for each of said plurality of memory cells in said memory cell array, wherein m is an integer equal to or more than two, and said CBR refresh unit comprises:
an instruction signal generator responsive to the CBR refresh command for applying a refresh instruction signal to each of said memory cells;
a refresh unit responsive to the refresh instruction signal for performing a refresh operation for each of said memory cells in a valid state; and
a CBR refresh control unit for setting said refresh unit in the valid state for each of said memory cells once per m receptions of the CBR refresh commands.

10. The semiconductor memory device according to claim 9, wherein said CBR refresh control unit further comprises:
a data holding circuit for holding control data; and
a skip unit responsive to m receptions of the CBR refresh commands for setting said refresh unit once in the valid state based on the control data.

11. The semiconductor memory device according to claim 10, wherein said skip unit sets said refresh unit in the valid state at all times when the control data is not held in said data holding circuit.

12. The semiconductor memory device according to claim 10, wherein said skip unit counts the CBR refresh commands when the control data is held in said data holding circuit, and sets said refresh unit in the valid state once when said skip unit counts the CBR refresh commands m times.

13. The semiconductor memory device according to claim 10, wherein said data holding circuit comprises a fuse, said fuse being cut for holding the control data.

14. The semiconductor memory device according to claim 13, wherein said fuse is cut based on a data holding time of said memory cells.

15. The semiconductor memory device according to claim 14, wherein said data holding circuit comprises a non-volatile memory, said control data being written into said non-volatile memory.

16. The semiconductor memory device according to claim 15, wherein said control data is written into said non-volatile memory based on a data holding time of said memory cells.

17. A semiconductor memory device comprising:
a memory cell array having a plurality of memory cells and m array units, where m is an integer equal to or more than two; and
a CBR refresh unit responsive to m receptions of CBR refresh commands for performing a refresh operation once for each of said m arrays.

18. The semiconductor memory device according to claim 17, wherein said CBR refresh unit comprises:
m refresh devices;
a refresh instructing unit responsive to the CBR refresh command for applying a refresh instruction signal to some of said m refresh devices in a valid state; and
a CBR refresh control unit responsive to the received CBR refresh command for setting one of said m refresh devices in the valid state,
wherein each of said m refresh devices is responsive to the refresh instruction signal for performing a refresh operation for a corresponding one of said m array units.

19. The semiconductor memory device according to claim 18, wherein said CBR refresh control unit further comprises:
a data holding circuit for holding control data; and
a skip unit for setting one of said m refresh devices in the valid state based on the control data.

20. The semiconductor memory device according to claim 19, wherein said skip unit sets all of said m refresh devices in the valid state at all times when the control data is not held in said data holding circuit.

21. The semiconductor memory device according to claim 19, wherein said skip unit counts the CBR refresh command when the control data is held in said data holding circuit to set said m refresh devices in the valid state in order.

22. The semiconductor memory device according to claim 19, wherein said data holding circuit comprises a fuse, said fuse being cut for holding the control data.

23. The semiconductor memory device according to claim 22, wherein said fuse is cut based on a data holding time of said memory cells.

24. The semiconductor memory device according to claim 19, wherein said data holding circuit comprises a non-volatile memory, said control data being written into said non-volatile memory.

25. The semiconductor memory device according to claim 24, wherein said control data is written into said non-volatile memory based on a data holding time of said memory cells.

26. A semiconductor memory device, comprising:
memory means comprising a plurality of memory cells; and
first refresh means responsive to m receptions of CBR refresh commands for performing one refresh operation for said memory means, wherein m is an integer equal to or more than two, and said first refresh means comprises:
second refresh means responsive to a refresh instruction signal for performing the refresh operation for said memory means;
instructing means which ignores the CBR refresh command in an invalid state, said instructing means responsive to the CBR refresh command for applying the refresh instruction signal to said second refresh means in a valid state; and
control means for setting said instructing means in the valid state once per m receptions of the CBR refresh commands.

27. A semiconductor memory device, comprising:
memory means having a plurality of memory cells; and
first refresh means responsive to m receptions of CBR refresh commands for performing a refresh operation once for each of said plurality of memory cells in said memory means, wherein m is an integer equal to or more than two, and said first refresh means comprises:
instruction means responsive to the CBR refresh command for applying a refresh instruction signal to each of said memory cells;
second refresh means responsive to the refresh instruction signal for performing a refresh operation for each of said memory cells in a valid state; and
control means for setting said second refresh means in the valid state for each of said memory cells once per m receptions of the CBR refresh commands.

* * * * *